United States Patent
Berkvens et al.

(10) Patent No.: US 8,681,308 B2
(45) Date of Patent: Mar. 25, 2014

(54) LITHOGRAPHIC APPARATUS AND DEVICE MANUFACTURING METHOD

(75) Inventors: Paul Petrus Joannes Berkvens, Veldhoven (NL); Roelof Frederik De Graaf, Veldhoven (NL); Paulus Martinus Maria Liebregts, Veldhoven (NL); Ronald Van Der Ham, Maarheeze (NL); Wilhelmus Franciscus Johannes Simons, Beesel (NL); Daniel Jozef Maria Direcks, Vaals (NL); Franciscus Johannes Joseph Janssen, Eindhoven (NL); Paul William Scholtes-Van Eijk, Eindhoven (NL); Gert-Jan Gerardus Johannes Thomas Brands, Waalre (NL); Koen Steffens, Heerlen (NL); Han Henricus Aldegonda Lempens, Weert (NL); Mathieus Anna Karel Van Lierop, Eindhoven (NL); Christophe De Metsenaere, Eindhoven (NL); Marcio Alexandre Cano Miranda, Waalre (NL); Patrick Johannes Wilhelmus Spruytenburg, Eindhoven (NL); Joris Johan Anne-Marie Verstraete, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 704 days.

(21) Appl. No.: 11/898,637

(22) Filed: Sep. 13, 2007

(65) Prior Publication Data

US 2009/0073395 A1    Mar. 19, 2009

(51) Int. Cl.
*G03B 27/52*    (2006.01)
*G03B 27/68*    (2006.01)
*G03B 27/42*    (2006.01)
*G03B 27/32*    (2006.01)
*G03B 27/54*    (2006.01)
*G03B 27/58*    (2006.01)

(52) U.S. Cl.
USPC ............ 355/30; 355/52; 355/53; 355/67; 355/72; 355/77

(58) Field of Classification Search
USPC .......... 355/30, 52, 53, 55, 77, 67–71, 72; 250/492.1, 492.2, 492.22, 548; 430/22, 430/311, 312, 320
See application file for complete search history.

(56) References Cited

U.S. PATENT DOCUMENTS 4,509,852 A    4/1985    Tabarelli et al. ............ 355/30
5,610,683 A *  3/1997    Takahashi .................. 355/53

(Continued)

FOREIGN PATENT DOCUMENTS

EP    1 420 298    5/2004
EP    1 420 299    5/2004

(Continued)

OTHER PUBLICATIONS

English translation of JP 2005-071717, publication of WO2005/071717, published on Aug. 4, 2005.*

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

An immersion lithographic apparatus is disclosed that includes a fluid confinement system configured to confine fluid to a space between a projection system and a substrate. The fluid confinement system includes a fluid inlet to supply fluid, the fluid inlet connected to an inlet port and an outlet port. The immersion lithographic apparatus further includes a fluid supply system configured to control fluid flow through the fluid inlet by varying the flow rate of fluid provided to the inlet port and the flow rate of fluid removed from the outlet port.

22 Claims, 5 Drawing Sheets

(56) References Cited

U.S. PATENT DOCUMENTS

| | | | |
|---|---|---|---|
| 6,952,253 B2 | 10/2005 | Lof et al. | |
| 7,075,616 B2 | 7/2006 | Derksen et al. | 355/30 |
| 7,119,874 B2 | 10/2006 | Cox et al. | 355/30 |
| 7,199,858 B2 | 4/2007 | Lof et al. | |
| 7,213,963 B2 | 5/2007 | Lof et al. | |
| 7,352,434 B2 | 4/2008 | Streefkerk et al. | |
| 7,365,828 B2 | 4/2008 | Takamura | |
| 7,388,648 B2 | 6/2008 | Lof et al. | |
| 7,593,093 B2 | 9/2009 | Lof et al. | |
| 7,639,343 B2 | 12/2009 | Hirukawa | |
| 7,697,110 B2 | 4/2010 | Nagasaka et al. | |
| 7,701,550 B2 | 4/2010 | Kemper et al. | |
| 7,795,603 B2 | 9/2010 | Lof et al. | |
| 7,847,916 B2 | 12/2010 | Hara et al. | |
| 7,907,255 B2 | 3/2011 | Sengers et al. | |
| 7,911,582 B2 | 3/2011 | Hirukawa et al. | |
| 7,932,999 B2 | 4/2011 | Hoogendam et al. | |
| 7,936,444 B2 | 5/2011 | Streefkerk et al. | |
| 2004/0075895 A1* | 4/2004 | Lin | 359/380 |
| 2004/0136494 A1 | 7/2004 | Lof et al. | 378/30 |
| 2004/0207824 A1 | 10/2004 | Lof et al. | 355/30 |
| 2004/0257544 A1* | 12/2004 | Vogel et al. | 355/30 |
| 2005/0048220 A1* | 3/2005 | Mertens et al. | 427/553 |
| 2005/0068499 A1* | 3/2005 | Dodoc et al. | 353/10 |
| 2005/0074704 A1* | 4/2005 | Endo et al. | 430/322 |
| 2005/0140948 A1* | 6/2005 | Tokita | 355/30 |
| 2005/0146695 A1* | 7/2005 | Kawakami | 355/30 |
| 2005/0259234 A1* | 11/2005 | Hirukawa et al. | 355/53 |
| 2005/0263068 A1* | 12/2005 | Hoogendam et al. | 118/668 |
| 2006/0038968 A1 | 2/2006 | Kemper et al. | 355/18 |
| 2006/0082746 A1* | 4/2006 | Mertens et al. | 355/53 |
| 2006/0152697 A1* | 7/2006 | Poon et al. | 355/53 |
| 2006/0187427 A1* | 8/2006 | Stavenga et al. | 355/30 |
| 2006/0209282 A1* | 9/2006 | Arai | 355/53 |
| 2007/0081140 A1 | 4/2007 | Beckers et al. | 355/72 |
| 2007/0109512 A1* | 5/2007 | Kate et al. | 355/53 |
| 2007/0242241 A1* | 10/2007 | Nagasaka et al. | 355/30 |
| 2008/0018868 A1* | 1/2008 | Yamamoto et al. | 355/30 |
| 2009/0190097 A1 | 7/2009 | Hoshino et al. | |
| 2009/0262316 A1* | 10/2009 | Kohno et al. | 355/30 |
| 2010/0195067 A1 | 8/2010 | Nagasaka et al. | |

FOREIGN PATENT DOCUMENTS

| | | | |
|---|---|---|---|
| EP | 1 420 300 | 5/2004 | |
| EP | 1 429 188 | 6/2004 | |
| EP | 1 494 079 | 1/2005 | |
| EP | 1 677 341 | 7/2006 | |
| JP | 2004-165666 | 6/2004 | |
| JP | 2004-289126 | 10/2004 | |
| JP | 2004-289127 | 10/2004 | |
| JP | 2004-289128 | 10/2004 | |
| JP | 2004-343114 | 12/2004 | |
| JP | 2005-005707 | 1/2005 | |
| JP | 2005-045223 | 2/2005 | |
| JP | 2006-060223 | 3/2006 | |
| JP | 2006-073892 | 3/2006 | |
| JP | 2006-165500 | 6/2006 | |
| JP | 2007-115758 | 5/2007 | |
| JP | 2007-184336 | 7/2007 | |
| TW | 200424790 | 11/2004 | |
| TW | 200426521 | 12/2004 | |
| TW | 200600980 | 1/2006 | |
| WO | WO 99/49504 | 9/1999 | |
| WO | 2004/053955 | 6/2004 | |
| WO | 2005/022615 | 3/2005 | |
| WO | WO 2005071717 A1 * | 8/2005 | H01L 21/027 |
| WO | WO 2006080516 A1 * | 8/2006 | |

OTHER PUBLICATIONS

Japanese Office Action mailed Feb. 2, 2011 in Japanese patent application No. 2008-227986.

Japanese Office Action mailed Jul. 15, 2011 in corresponding Japanese Patent Application No. 2008-227986.

* cited by examiner

Fig. 2
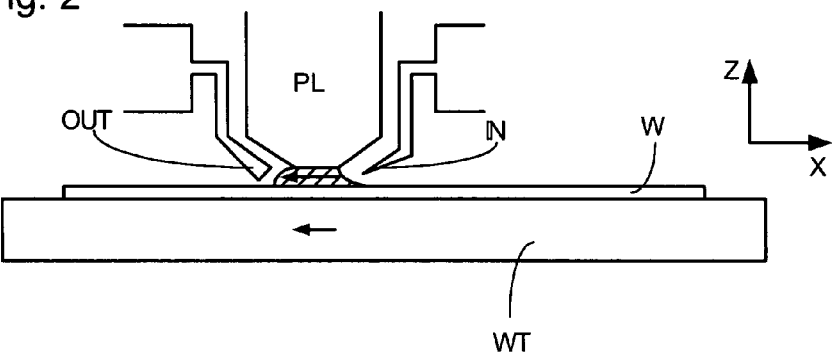
Fig. 3
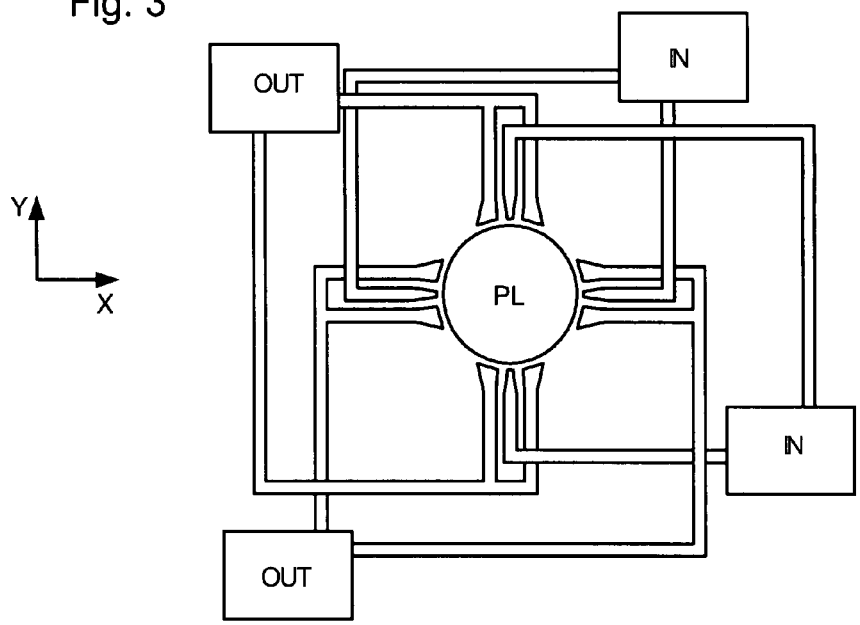
Fig. 4
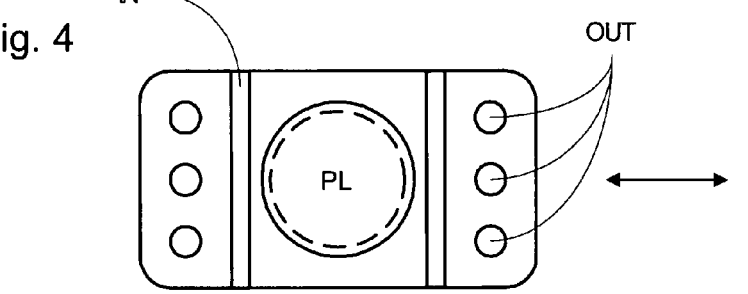
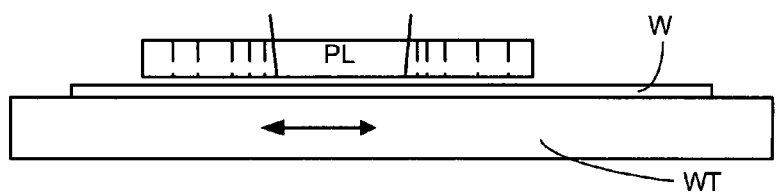

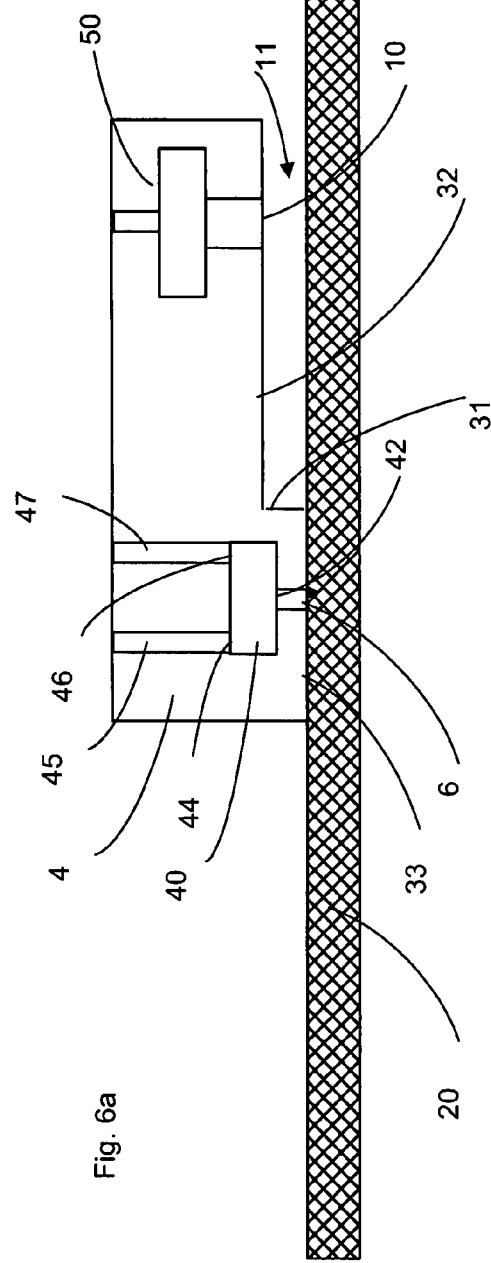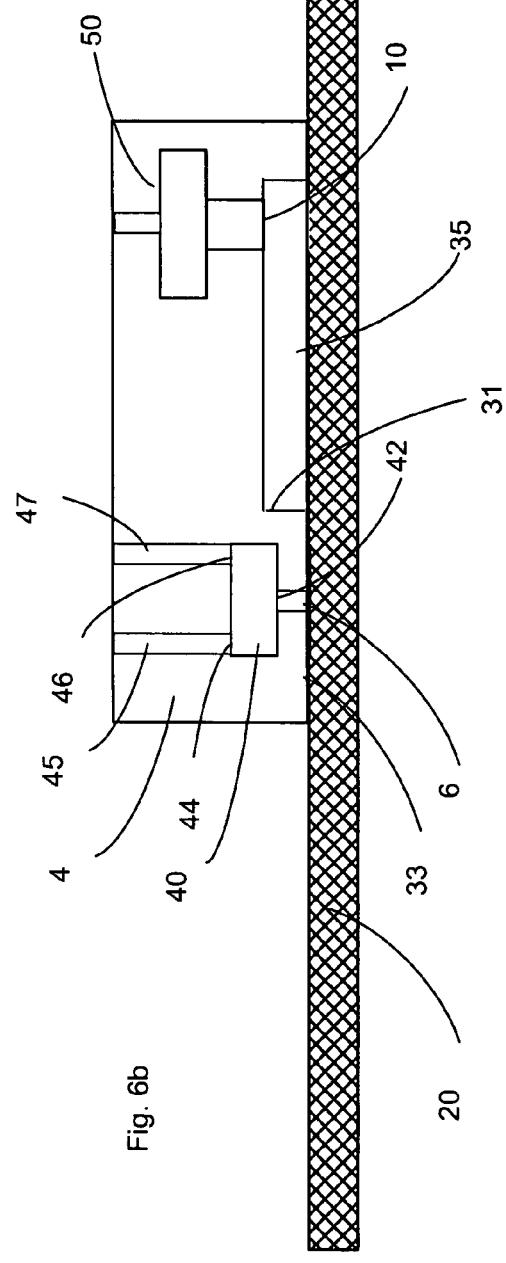

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although one or more other liquids may be used. An embodiment of the present invention will be described with reference to liquid. However, fluids may also be suitable, particularly fluids with a higher refractive index than air, desirably a higher refractive index than water. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system IH to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, desirably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system IH is shown in FIG. 4. Liquid is supplied by two groove inlets IN on either side of the projection system PL. The liquid is removed by a plurality of discrete outlets OUT arranged radially outwardly of the inlets IN. The inlets IN and OUT can be arranged in a plate with a hole in its center. Through the hole, the projection beam is projected. Liquid is supplied by one groove inlet IN on one side of the projection system PL. Liquid is removed by a plurality of discrete outlets OUT on the other side of the projection system PL. This arrangement causes a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure IH is substantially stationary relative to the projection system in the XY plane though there may be some relative movement in the Z direction (in the direction of the optical axis). In an embodiment, a seal is formed between the liquid confinement structure and the surface of the substrate. The seal may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11. The flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

In European patent application publication no. EP 1494079, a liquid confinement system which comprises, in a single bottom surface of a barrier member a liquid inlet. Radially outwardly thereof is an extraction outlet for gas and liquid. In that liquid supply system the barrier member is at least partly supported by the substrate table through hydrostatic or hydrodynamic pressure of liquid exiting the inlet i.e. the liquid inlet forms a liquid bearing. FIG. 5 illustrates such a liquid confinement system.

European patent application publication no. EP 1420299 discloses an immersion lithographic apparatus in which the final element of the projection system can be maintained wet during, for example, substrate swap by use of a shutter member which can be attached to the liquid supply system and block it. In this way liquid can be maintained in the liquid supply system so that the final element of the projection system is maintained wet and the leaking of liquid from the liquid supply system can be prevented.

SUMMARY

It is desirable to provide an improved immersion lithographic apparatus. For example, it is desirable to provide an apparatus in which a barrier member can be combined with a shutter member so as to keep a final element of the projection system wet during substrate swap.

According to an aspect of the invention, there is provided an immersion lithographic apparatus, comprising: a fluid confinement system configured to confine fluid to a space between a projection system and a substrate, the fluid confinement system comprising a fluid inlet to supply fluid, the fluid inlet connected to an inlet port and an outlet port; and a fluid supply system configured to control fluid flow through the fluid inlet by varying the flow rate of fluid provided to the inlet port and the flow rate of fluid removed from the outlet port.

According to an aspect of the invention, there is provided an immersion lithographic apparatus comprising: a liquid confinement system configured to confine liquid between a projection system and a substrate, the liquid confinement system comprising: a liquid supply inlet configured to direct a flow of liquid with a component towards the substrate and/or a substrate table configured to support a substrate, and an extraction outlet configured to extract therethrough liquid from the liquid supply inlet and/or gas from outside of the liquid confinement system, the extraction outlet being in a first surface of the liquid confinement system which is further from the substrate and/or a substrate table than a second surface in which the liquid supply inlet is located.

According to an aspect of the invention, there is provided an immersion lithographic apparatus comprising: a fluid confinement system for confining fluid between a final element of a projection system and a substrate, the fluid confinement system comprising: a fluid supply outlet for directing a flow of fluid with a component towards the substrate; and an extraction inlet for the extraction therethrough of fluid from the fluid supply outlet and/or gas from outside of the fluid confinement system, wherein the extraction inlet is in a first surface of the fluid confinement system which is further from the substrate and/or a substrate table which is for supporting a substrate than a second surface in which the fluid supply outlet is positioned.

According to an aspect of the invention, there is provided an immersion lithographic apparatus, comprising: a fluid confinement system configured to confine fluid to a space between a projection system and a localized area of the substrate; a shutter member positionable on an underside of the fluid confinement system opposite the projection system such that the fluid can be confined by the fluid confinement system; and a projection on a surface of the shutter member facing the fluid confinement system, a position of the projection, when adjacent the underside, corresponding to a fluid supply outlet in the underside, but not to an extraction inlet in the underside.

According to an aspect of the invention, there is an immersion lithographic apparatus comprising: a fluid confinement system configured to confine fluid to a space between a projection system and a substrate, the fluid confinement system comprising a conduit for a fluid flow, the fluid confinement system having: an outlet in the conduit configured to supply fluid to the space, the outlet being intermediate ends of the conduit; a flow restriction located in the outlet or downstream of the outlet in the conduit in the direction of flow of fluid; and a valve located in the conduit so that the valve is operable to control the rate of fluid flow though the outlet and so that fluid flows through the conduit continuously.

According to an aspect of the invention, there is provided a device manufacturing method comprising projecting a patterned beam of radiation through a fluid confined in a space using a fluid confinement system onto a substrate, wherein the fluid confinement system is at least partly borne by a flow of fluid out of a fluid supply inlet toward the substrate, and a fluid flow rate to the fluid supply inlet is regulated by the flow of fluid into an inlet port connected to the fluid supply inlet and the flow of fluid out of the fluid supply inlet via an outlet port also connected to the fluid supply inlet.

According to an aspect of the invention, there is provided a device manufacturing method comprising projecting a patterned beam of radiation through a liquid confined in a space using a liquid confinement system onto a substrate, wherein the liquid confinement system comprises: a liquid supply inlet through which a flow of liquid is directed with a component towards the substrate and/or a substrate table configured to support a substrate; and an extraction outlet through which liquid from the liquid supply inlet and/or gas from outside of the liquid confinement system are extracted, the extraction outlet being in a first surface of the liquid confinement system which is further from the substrate and/or a substrate table, than a second surface in which the liquid supply inlet is located.

According to an aspect of the invention, there is provided a method of swapping a substrate for another under a fluid confinement system, the method comprising: relatively moving a first substrate from under the fluid confinement system and moving a shutter member under the fluid confinement system such that a projection on the shutter member is in a position under at least a fluid supply inlet in the undersurface of the fluid confinement system but not an extraction outlet in the underside of the fluid confinement system; relatively moving the shutter member from under the fluid confinement system; and moving a second substrate under the fluid confinement system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIGS. 6a and b illustrate, in cross-section, two liquid confinement systems according to an embodiment of the present invention;

DETAILED DESCRIPTION

Figure 1:
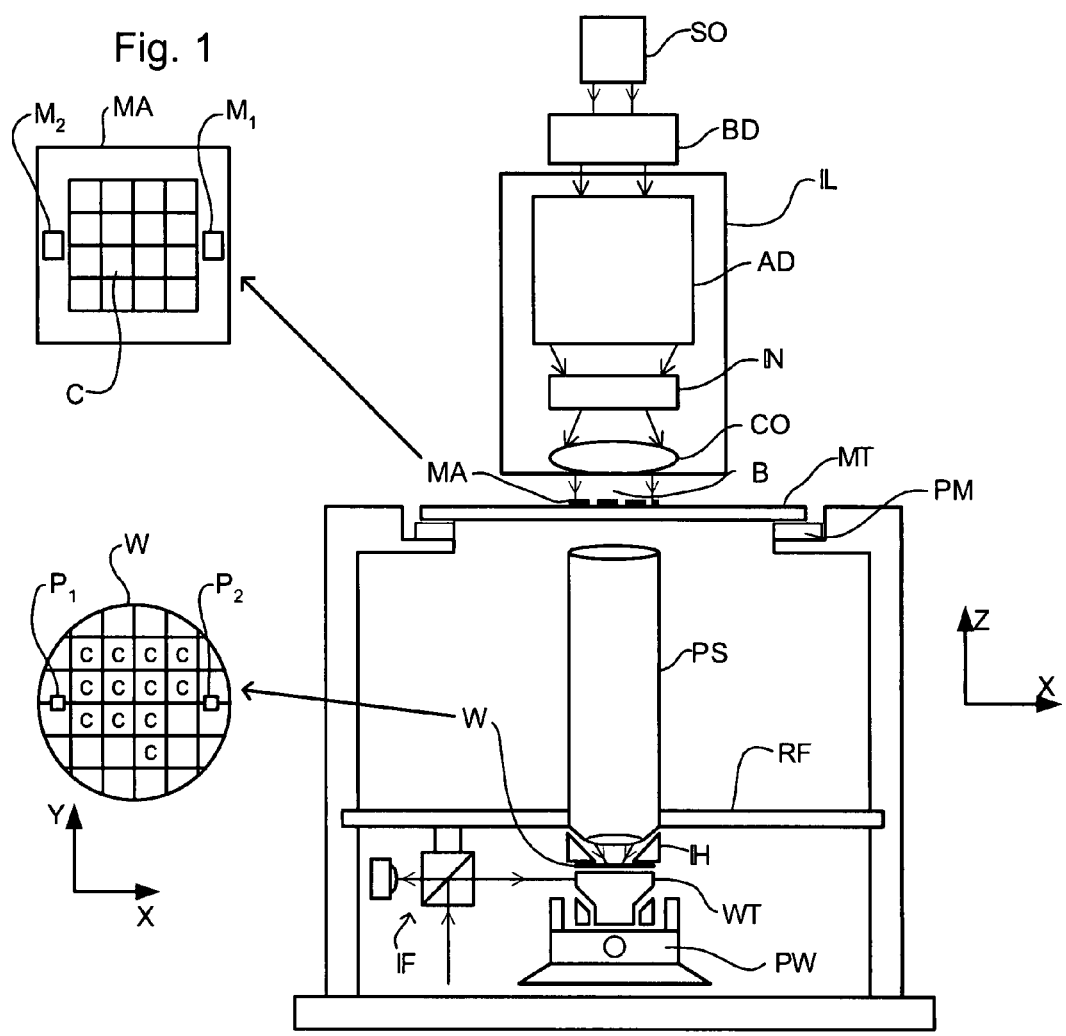
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W and supported by a frame RF.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures, e.g. a mask table). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
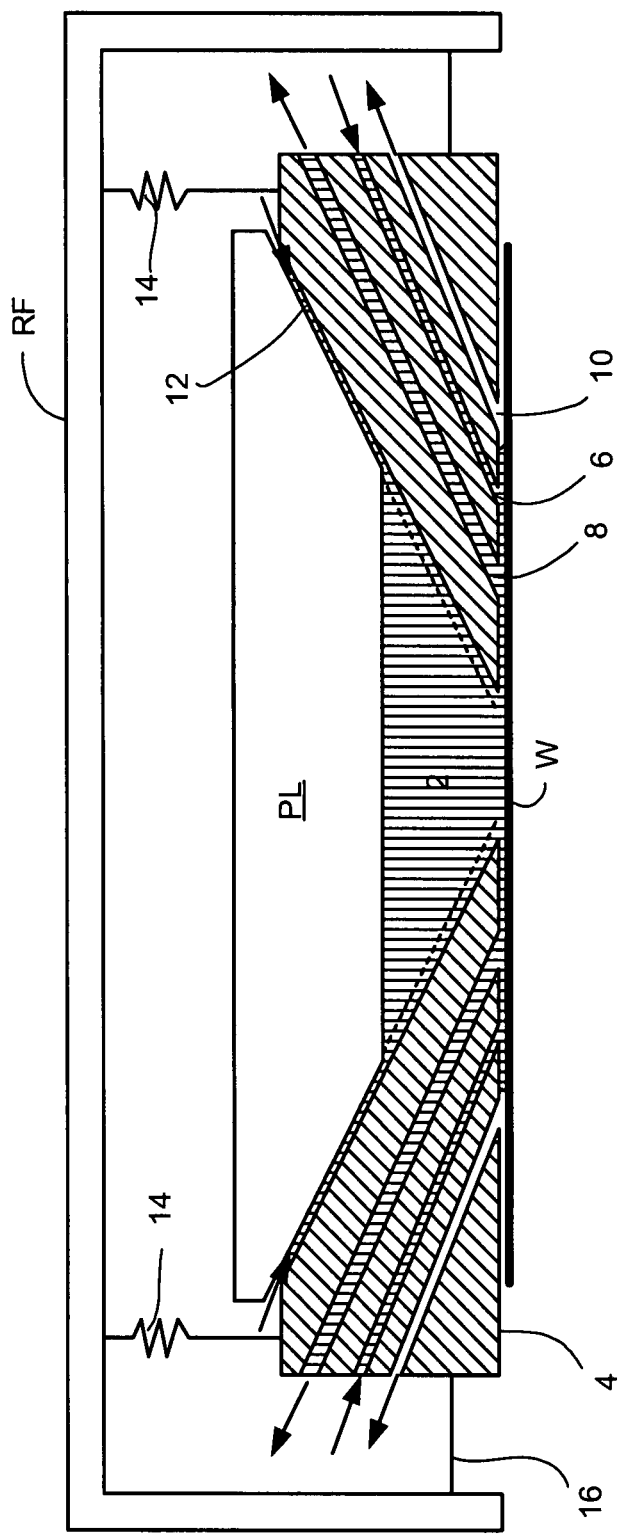
FIG. 5 depicts a further liquid supply system in which a seal and a bearing between the liquid supply system and the surface of the substrate is formed by a flow of liquid.

FIG. 5 illustrates a liquid confinement system 4, IH which may be used with the liquid supply system and/or shutter member of an embodiment of the present invention. The liquid confinement system 4 of FIG. 5 is described in order to give an understanding of some of the problems that may be overcome by an embodiment of the present invention.

A liquid fills a space 2 between a final element of the projection system PL and the substrate W. A liquid confinement system 4 (which is sometimes called a seal member or a barrier member) is arranged between the final element of the projection system PL and the surface of the substrate W. It defines a space 2 with inner side walls. A liquid seal is formed between the seal member 4 and the surface of the substrate W. This prevents leakage of liquid from the space 2.

The liquid confinement member 4 has a liquid supply inlet 6 and a liquid outlet 8. The inlet 6 and outlet 8 are in the surface of the liquid confinement member 4 which faces the substrate (hereinafter referred to as the primary surface). The outlet 8 is located radially inwardly of the inlet 6 with respect to the optical axis of the projection system PL. In an embodiment, the inlet 6 may be located radially inwardly of the outlet 8. A liquid seal is formed by the flow of liquid from the inlet 6 to the outlet 8.

The liquid confinement system 4 may be at least partly supported by a hydrostatic/hydrodynamic bearing defined by the liquid between the liquid confinement system 4 and the substrate W. This hydrostatic/hydrodynamic bearing can then at least partly support the liquid confinement system 4 as well as providing a liquid seal to prevent leakage of the liquid from the space 2. Otherwise or additionally, the liquid confinement system may be supported by one or more springs or actuators 14.

An extraction outlet 10 is also formed in the primary surface of the liquid confinement system 4. The extraction outlet 10 is outwards in a radial direction from the inlet 6 with respect to the optical axis. The extraction outlet 10 is arranged to extract any liquid which may escape from the seal into the area of the substrate W not immersed in liquid.

An additional liquid inlet 12 is formed in the space 2. This additional liquid inlet 12 is used to supply liquid into the space 2.

FIG. 5 depicts the liquid confinement system in cross-section. It will be appreciated that the inlets 6 and 12 and the outlets 8 and 10 can extend continually around liquid filled space 2. Thus, the inlets 6 and 12 and outlets 8 and 10 may form a groove when viewed from the surface of the substrate. This groove can be annular, rectangular or polygonal. Alternatively, the inlets and outlets can be provided at discrete locations in a groove. The groove may be continuous or discontinuous and may optionally not extend continually around the space.

A horizontal member 16 connects the liquid confinement system 4 to the sides of a reference frame RF. This member provides support for the liquid confinement system 4 in addition to the liquid bearing and also ensures that the correct horizontal position is maintained. It keeps the liquid confinement system 4 substantially stationary with respect to the projection system PL in the horizontal, xy plane. The member 16 allows relative movement in the vertical, z, direction and tilt in the vertical plane.

Optionally, one or more adjustable passive (or active) springs or actuators 14 can be used to apply a biasing force to the liquid confinement system 4 in the direction of the substrate W. This biasing force allows the operating pressure of the hydrostatic/hydrodynamic bearing to be altered without needing to alter the dimensions of the bearing.

The force exerted by the hydrostatic/hydrodynamic bearing (and any force applied by the spring(s) or actuator(s) 14) should match the force exerted downwards due to gravity on the liquid confinement system 4. The force is equal to the pressure multiplied by effective surface area over which the bearing acts.

There may be one or more difficulties associated with using the liquid confinement system of FIG. 5 with a shutter member. A shutter member can be seen as being a member which is placed in the same position as the substrate W so that liquid in the space 2 does not flow out of the liquid confinement system. The shutter member 20 may be independently moveable of the substrate table WT or can be part of the substrate table WT.

A convenient way of attaching the shutter member is to use the extraction outlet 10 to create an attractive force between the liquid confinement system 4 and the shutter member. The shutter member comes into contact with the primary surface of the liquid confinement system 4. The flow of liquid in and out of the inlets and outlets 6, 8 is stopped or reduced. In that way the shutter member comes into contact with the primary surface of the liquid confinement system 4.

Figure 7A:
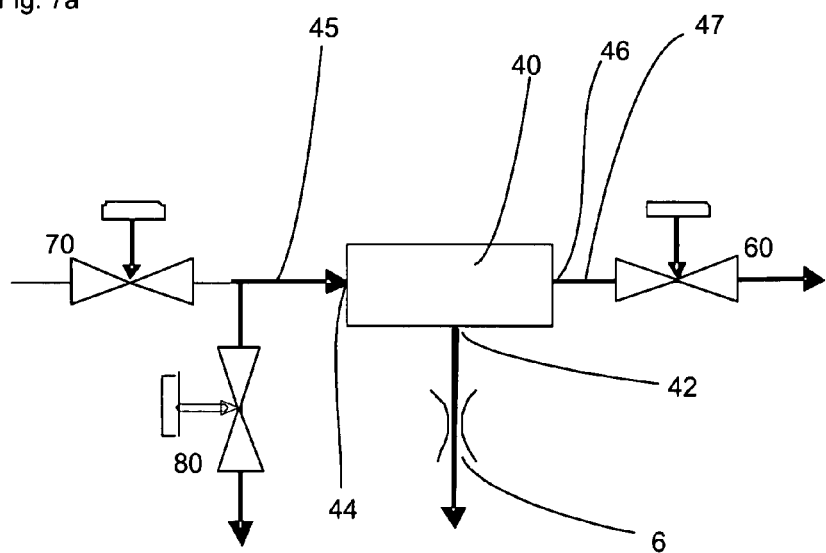
FIGS. 7a and b illustrate two liquid supply systems according to embodiments of the present invention.

A difficulty of this system is that the liquid standing in the liquid confinement system may collect contaminants. Also or additionally, the temperature of the liquid confinement system 4 can vary because of a change in flow rate of liquid through it. One or more of these problems may be addressed by the fluid control system, shutter member and liquid confinement system of an embodiment of the present invention described below with reference to FIGS. 6-8. The embodiments of FIGS. 6-8 may have an advantage in common, namely the reduction in defects in the imaged product. This is accomplished by having liquid flow substantially continuously in the liquid confinement system 4. That is stationary liquid in the liquid confinement system is, at least to a large extent, avoided.

FIG. 6 shows, in cross-section, one half of a liquid confinement system 4 according to an embodiment of the present invention. In the liquid confinement system of FIG. 6, the projection system PL would be situated on the left hand side as illustrated. On the primary surface, which is the bottom or under surface of the liquid confinement system 4, there is positioned a liquid supply inlet 6. The liquid supply inlet 6 is the radially most inward component on the under surface of the liquid confinement system. The liquid entering the liquid supply inlet 6 is greater than atmospheric pressure typically at about 0.5 bar gauge.

Radially outwardly of the liquid supply inlet 6 is an extraction outlet 10. The extraction outlet 10 causes a radially inward flow of gas from outside of the liquid confinement system 4 (indicated by arrow 11). That flow of gas is effective to seal liquid which moves radially outwardly from the liquid supply inlet 6 so that most, if not all, such liquid is extracted through outlet 10.

In this embodiment no liquid outlet is illustrated in the underside though such a component may be present. For example, a single phase liquid extractor may be present such as the one disclosed in United States patent application publication No. US 2006-0038968. Any number of components may be present on the bottom surface. There may be no active components radially outwardly of the extractor outlet 10 (for example there may not be a gas knife radially outwardly of the extractor outlet 10, or any such gas knife may be turned off).

As illustrated in FIG. 6a, a shutter member 20 is in the attached position. In the attached position the shutter member 20 is in contact with the primary or undersurface of the liquid confinement system 4. In this position no liquid flows out of the inlet 6, but the flow of gas through the extraction outlet 10 is maintained. This creates an under pressure between the liquid confinement system 4 and the shutter member 20 so that the shutter member 20 is attracted to the bottom of the liquid confinement system 4 and thereby attached. A flow of liquid through the liquid confinement system 4 can be maintained as described below with reference to FIG. 7.

If the height of the liquid confinement system 4 over an object, such as the substrate table, substrate or shutter member, becomes very small it is hard to predict the capillary force which can get very high. Generally the strength of the capillary force is inversely proportional to the height. If the height is low (say 0-10 μm) large force differences can occur. The design height is the average distance of the bottom of the liquid confinement system over the object. For example, the topography of the substrate can vary by ±50 μm from a nominal level. If the design height is about 100 μm, the differences in force are much lower because the distance will be between 50 and 150 μm. Because an embodiment of the present invention results in better control of the height of the liquid confinement system, the generation of unpredictable capillary forces may be avoided. The height of the liquid confinement system can be chosen such that any contaminant particles in the liquid can pass between the liquid confinement system and the object (e.g., substrate, substrate table or shutter member) with out scratching the object. Thus the height can be controlled to be at least the largest dimension of any expected contaminant particle.

Furthermore, improved control over the height of the liquid confinement system 4 may be achieved by the step 31 in the undersurface of the liquid confinement system 4. This helps to ensure that a first surface 32 in which the extraction outlet 10 is formed is further from the applicable object (e.g., the substrate table and/or the shutter member 20) than a second surface 33 through which surface 33 the liquid supply inlet 6 passes. The difference in height may be less than 1 mm and desirably less than 0.4 mm. The difference in height may be between 10 and 50 μm, desirably between about 25 and 35 μm, desirably about 30 μm. The benefit of this arrangement will be discussed below. It results in a balance of the repulsive force generated by flow of liquid out of the liquid supply inlet 6 and the attractive force generated by the extraction outlet 10 being connected to an under pressure. Typically the difference in height between the first surface 32 and second surface 33 can be expressed as a ratio. For example, the first surface is usually between about 1/10 to 3 times further from the object than the second surface.

The hydrostatic/hydrodynamic bearing can support as much as 10% (or in certain circumstances more) of the weight of the liquid confinement system. The rest of the weight of the liquid confinement system may be taken by one or more springs or actuators 14. When the shutter member is attached, all the weight of the liquid confinement system 4 may be taken by the one or more springs or actuators 14.

A hydrostatic/hydrodynamic bearing is achieved by the presence of liquid from the liquid supply inlet 6 being between the liquid confinement system 4 and the substrate W, substrate table WT or shutter member 20 as appropriate. The flow of liquid out of the liquid supply inlet 6 generates a repulsive force between those two objects whereas the flow of liquid and gas into the extraction outlet 10 generates an attractive force. If a gas knife was present this would provide further repulsive force. That might help in avoiding crash situations in which the liquid confinement system 4 is pulled towards the shutter member 20 or substrate W or substrate table WT, and/or vice versa. That can cause an undesirable and uncontrolled crash between those two objects or bring the objects close enough together such that particles between the objects scratch one or both objects.

However, when no gas knife is present or the gas knife is inactive, as the liquid confinement system 4 comes closer to the applicable object (and/or when the applicable object comes closer to the liquid confinement system 4), both the repulsive force and the attractive forces will increase. By ensuring that the first surface 32 is further from that object than the second surface 33, this will help ensure that the repulsive force will increase faster than the attractive force, helping to prevent collision between the liquid confinement system 4 and the object. Even greater control can be achieved by varying the flow of liquid out of the liquid supply inlet 6 as described below.

Of course the outlet 10 in the first surface 32 can have rounded edges in the form of an arc or an arbitrary curved profile such as described in relation to the third embodiment of European patent application publication no. EP 1494079. What is desirable is that the surface through which the outlet 10 extends is further away from the substrate W, substrate table WT or shutter member 20 as appropriate than the surface through which the inlet 6 extends.

FIG. 6b illustrates a further embodiment which is the same as that illustrated in FIG. 6a except that instead of a step being formed in the primary surface of the liquid confinement system 4, a groove 35 is formed. In effect this means that the first surface 32 is an upper wall of a recess in the undersurface of the liquid confinement system 4. In this embodiment the under pressure generated by the outlet 10 is the same. However, the under pressure is applied over a larger area than if the outlet 10 were in a surface which is at the same level as the second surface 33. Thus, the force is larger and the object can be clamped with a higher force.

As illustrated in FIG. 6, the liquid supply inlet 6 and extraction outlet 10 are connected via chambers 40, 50 respectively to a liquid supply and an under pressure source respectively. These chambers are effective to even out pressure fluctuations. It will be appreciated that the chamber 40 (or 50) can be made so small that the various conduits simply join together.

With respect to the chamber 40 is a liquid chamber outlet 42 which leaves the chamber via a conduit that is connected to the liquid supply inlet 6. The chamber 40 also has an inlet port 44 which leaves via a conduit 45 to a liquid supply as well as an outlet port 46 which leaves via a conduit 47 to a drain or a low pressure source. The liquid can optionally be recycled. Such recycling may involve filtration of contaminant particles.

A controller may be provided to control extraction through the outlet(s) 8, 10. The controller may control one or more valves. The controller may also control liquid flow through the inlet(s) 6, 12. The controller may control extraction through the outlet and liquid flow through the inlet at a level such that, in use, combined with the geometry of the underside of the liquid confinement system, a repulsive force between the liquid confinement system and the applicable object is generated. This repulsive force is generated by ensuring that the liquid flow through the inlet produces a force which is greater than the attractive force between the liquid confinement system and the object that is generated by flow through the outlet. This may be arranged such that it is true irrespective of the height of the liquid confinement system over the object.

FIG. 7 shows a liquid supply system to control liquid flow out of the liquid chamber outlet 42 and thereby out of the liquid supply inlet 6 (which acts as a flow restriction). This is achieved by a first valve 60 connected between the outlet port 46 and a drain. In normal operation during, for example, scanning when the liquid confinement system 4 is borne by liquid exiting the inlet 6, the first valve 60 is at least partly closed. When liquid is no longer required to flow out of the inlet 6, for example during clamping of a shutter member 20 to the underside of the liquid confinement system 4, the first valve 60 is left at least partially open. Thus, a flow of liquid through the liquid confinement system 4 can be maintained while flow through the inlet 6 is turned off. The outlet port 46 is not a fluid inlet to provide liquid to the space; the outlet port 46 is configured to remove liquid from the liquid confinement system 4. The inlet port 44 is configured to be connected to a liquid supply.

This results in there being less liquid standing in the liquid confinement system, for example during substrate swap, thereby possibly reducing the risk of particle contamination. Furthermore, having a flow of liquid through the liquid confinement system 4 helps to ensure that it maintains a substantially constant temperature (e.g., there is a substantially constant rate of heat transfer from the liquid confinement system 4 to the liquid). The first valve 60 can be continuously variable or can have two or three or more positions. This allows the flow rate of liquid out of the inlet 6 to be varied, thereby varying the bearing strength.

During, for example, release of the shutter member 20, the first valve 60 can also be temporarily closed to help generate a releasing force. The first valve 60 can also be closed in an emergency. This ensures maximum repelling force between the liquid confinement system 4 and the object on which the liquid confinement system 4 is supported (or the object held). This helps to repel the object away from the liquid confinement system 4. This may be achieved by a maximum flow rate of liquid out of the inlet 6. Thereafter the first valve 60 may be opened to prevent flooding of the apparatus.

Thus, as can be seen, the liquid confinement system 4 and liquid supply system may also result in faster and safer attachment/release of the shutter member 20.

It is also possible to provide a second valve 70 between the liquid supply and the inlet port 44. Generally this valve will be left open apart from during installation. Further, a third valve 80 may be provided between the inlet port 44 and a drain. This valve is generally kept closed except in an emergency when it is opened after the first valve 60 is closed. Thus, a repulsive force pulse can be generated between the liquid confinement system 4 and the object which is below it if they get too close together. Thus scratching can be avoided as well as collision and then liquid can flow into the drain to prevent flooding of the apparatus. Of course there may be other ways of operating the system and in particular it may not be necessary to have both first and second valves 60, 70. Furthermore, third valve 80 is an optional feature.

A control system can be provided for controlling all three valves 60, 70, 80 in the above described manner.

As will be appreciated, this liquid supply system can be used with other arrangements of liquid confinement systems other than those illustrated in FIGS. 6a and 6b. The liquid supply system is particularly suitable for use with liquid borne confinement systems but it can also be used with other forms of liquid confinement system. A liquid borne confinement system is one in which at least part of the weight of the confinement system is supported by a layer of liquid. The liquid supply system can be used for liquid supply inlet 6 or all liquid supply inlets or only some liquid supply inlets of the liquid confinement system. A separate liquid supply system can be used to fill the space 2 with liquid, if necessary.

Figure 7B:
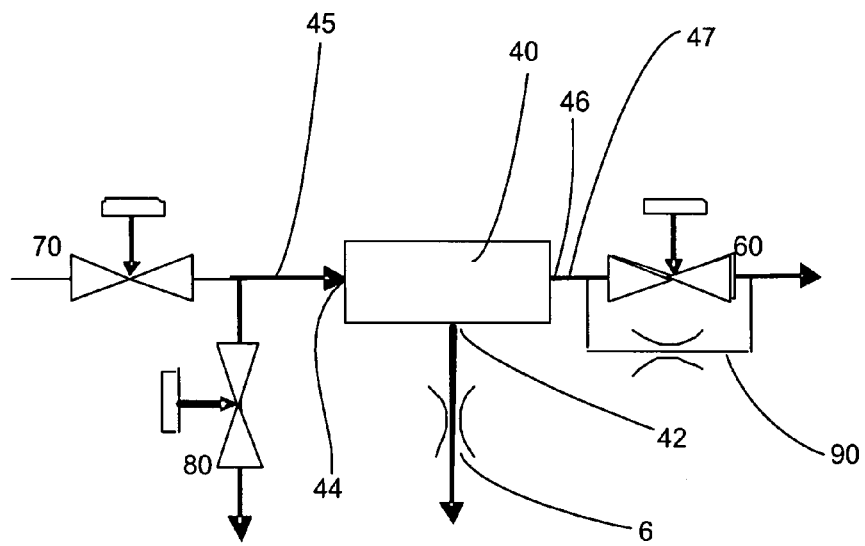

FIG. 7b illustrates a further embodiment of a liquid supply system. This embodiment is the same as that of FIG. 7a except that a by-pass conduit 90 is provided in parallel to the first valve 60. The by-pass 90 is provided with a flow restriction. The by-pass 90 is always open. Thus, there is always a flow of liquid through the by-pass 90 even when the first valve 60 is closed. In this way there will be a reduced amount or no stationary liquid in the system. Also any pressure variation as a result of opening or closing valve 60 may be reduced.

Of course the first and second valves 60, 70 are illustrated and described as being downstream and upstream of the outlet port 46 and inlet port 44 respectively. However, it is possible for the first valve 60 to be positioned upstream of the outlet port 46. It is also possible for the second valve 70 to be positioned downstream of the inlet port 44. Indeed, it may be difficult to identify an inlet port or an outlet port and another way of viewing the system is as follows. A conduit is provided for fluid flow. The conduit is connected, for example by a chamber outlet 42, to an inlet for supplying liquid to the space. That chamber outlet 42 may comprise a flow restriction. Additionally or alternatively there may be a flow restriction downstream of the connection to the inlet in the conduit. At least one valve is located in the conduit. The valve is operable to control the rate of fluid flow through to the inlet 6. The valve may also ensure that fluid flows through the conduit continuously. The valve may be positioned upstream or downstream of the connection to the inlet 6.

Thus in an embodiment, when the valve is open, substantially all the flow of the fluid flows through the valve, and when the valve is closed, all the flow of fluid flows through the inlet, and may flow through the chamber outlet 42. Advantageously, the fluid flow through the liquid confinement system is continuous. Desirably the outlet (which is connected to the inlet 6) may be intermediate the ends of the conduit.

Figure 8:
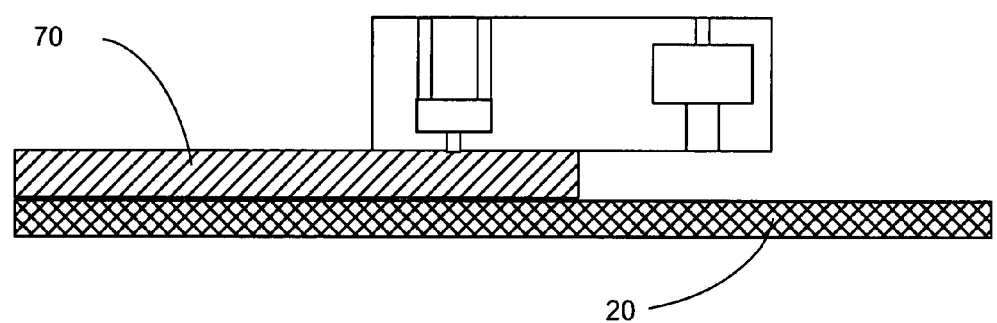
FIG. 8 illustrates a shutter member according to an embodiment of the present invention in combination with a liquid confinement system.

FIG. 8 illustrates a liquid confinement system 4 which is similar to that in FIG. 6 except that the liquid supply inlet 6 and extraction outlet 10 are formed in a single surface so that they are in a surface which is the same height from a substrate. The liquid confinement system 4 is shown with a shutter member 20 attached. However, a similar effect can be achieved as provided by the step 31 in the liquid confinement system of FIG. 6 by providing a protrusion 70 on a top surface of the shutter member 20. The protrusion 70 need only protrude at a position under the liquid supply inlet 6 and could therefore be annular though in FIG. 8 it is shown as being circular. The protrusion can be provided on the shutter member 20 in the form of a sticker or it can be formed out of the shutter member (e.g. machined) or glued thereon. The effect of the protrusion is to increase the area of the shutter member 20 exposed to the under pressure of the extraction outlet. As in the embodiments of FIG. 6, this results in a greater attractive force.

The shutter member 20 of FIG. 8 can also be used with the liquid confinement system 4 of FIG. 5 or 6.

Although the invention has been described above in relation to the use of an immersion liquid, actually the liquid can instead be a non-liquid fluid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage media (e.g. semiconductor memory, magnetic or optical disk) having such one or more computer programs stored therein. In particular, at least one controller can be provided to control at least a component of the apparatus.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid, i.e. a leaky confinement immersion system.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used. However, it is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus, comprising:
a fluid confinement system configured to confine fluid to a space between a projection system and a substrate, the fluid confinement system comprising a fluid inlet conduit configured to supply fluid to the space, the fluid inlet conduit having an opening to the space at one end and intersecting at the other end a fluid flow conduit having an inlet port and an outlet port, the inlet port and the outlet port being upstream and downstream, respectively, of the intersection between the fluid inlet conduit and the fluid flow conduit; and
a fluid supply system configured to control fluid flow through the fluid inlet conduit by varying the flow rate of fluid provided to the inlet port and the flow rate of fluid removed from the outlet port without using a valve in the fluid inlet conduit.

2. The immersion lithographic apparatus of claim 1, wherein the fluid inlet conduit opening is in an underside of the fluid confinement system.

3. The immersion lithographic apparatus of claim 1, wherein the fluid supply system comprises a valve configured to vary a cross-sectional area of a conduit leading from the outlet port or of the fluid flow conduit bringing the fluid inlet conduit and outlet port into fluid communication.

4. The immersion lithographic apparatus of claim 3, further comprising, in parallel to the valve, a by-pass conduit comprising a flow restrictor.

5. The immersion lithographic apparatus of claim 1, wherein the fluid supply system comprises a valve configured to vary a cross-sectional area of a conduit connected between a fluid source and the inlet port or of the fluid flow conduit bringing the fluid inlet conduit and inlet port into fluid communication.

6. The immersion lithographic apparatus of claim 1, wherein the fluid supply system comprises a valve configured to vary a cross-sectional area of a conduit which places the inlet port in fluid communication with a drain.

7. The immersion lithographic apparatus of claim 1, further comprising a controller configured to control a valve associated with the fluid supply system, the controller configured to vary the flow of fluid through the inlet and outlet ports to change the flow rate of fluid through the fluid inlet conduit.

8. The immersion lithographic apparatus of claim 7, wherein the controller is configured to maintain the flow rate of fluid as substantially constant.

9. The immersion lithographic apparatus of claim 1, wherein the fluid supply system is configured to vary the flow rate of fluid provided to the inlet port and the flow rate of fluid removed from the outlet port using a single valve for both the inlet and outlet port.

10. The immersion lithographic apparatus of claim 9, wherein the single valve is positioned upstream or downstream of the inlet port or upstream or downstream of the outlet port.

11. The immersion lithographic apparatus of claim 1, further comprising a shutter member positionable on an underside of the fluid confinement system opposite the projection system such that the fluid can be confined by the fluid confinement system, the shutter member having a projection on a surface of the shutter member facing the fluid confinement system, a position of the projection, when adjacent the underside, corresponding to a fluid supply inlet in the underside, but not to an extraction outlet in the underside.

12. An immersion lithographic apparatus comprising:
a fluid confinement system configured to confine fluid between a projection system having an optical axis and a substrate, the fluid confinement system comprising:
a fluid supply inlet configured to direct a flow of fluid with a component towards the substrate and/or a substrate table configured to support a substrate, and
an extraction outlet to extract therethrough fluid from the fluid supply inlet and/or gas from outside of the fluid confinement system, the extraction outlet being in a first surface of the fluid confinement system, the extraction outlet located further from the substrate and/or a substrate table than the fluid supply inlet located in a second surface,
wherein the first surface, the second surface, or both the first and second surface, has a first flat portion that extends from a side of the respective inlet and/or outlet toward the optical axis and a second flat portion, co-planar with the first flat portion, that extends from an opposite side thereto of the respective inlet and/or outlet away from the optical axis,
wherein the first surface is substantially parallel to a top surface of the substrate and/or substrate table,
wherein, in use, the first surface is about $1/10$ to 3 times further from the substrate and/or substrate table than the second surface, and
wherein the extraction outlet is the most radially outward active component in the underside of the fluid confinement system, relative to an optical axis of the projection system.

13. The immersion lithographic apparatus of claim 12, wherein the first surface extends to a plan edge of the fluid confinement system.

14. The immersion lithographic apparatus of claim 12, wherein the first surface is an upper wall of a recess in the undersurface of the fluid confinement system.

15. The immersion lithographic apparatus of claim 12, further comprising a controller configured to control extraction through the extraction outlet and fluid flow through the fluid supply inlet at a level such that, in use, combined with the geometry of the underside of the fluid confinement system, a repulsive force between the fluid confinement system and the substrate and/or substrate table generated by fluid flow through the fluid inlet is greater than an attractive force between the fluid confinement system and the substrate and/or substrate table generated by flow through the extraction outlet, irrespective of the displacement between the fluid confinement system and the substrate and/or substrate table.

16. A device manufacturing method comprising projecting a patterned beam of radiation through a fluid confined in a space using a fluid confinement system onto a substrate, wherein the fluid confinement system is at least partly borne by a flow of fluid out of a fluid supply inlet conduit toward the substrate, the fluid supply inlet conduit having an opening to the space at one end and intersecting at the other end a fluid flow conduit having an inlet port and an outlet port, the inlet port and the outlet port being upstream and downstream, respectively, of the intersection between the fluid supply inlet conduit and the fluid flow conduit, and a fluid flow rate to the fluid supply inlet conduit is regulated by the flow of fluid into an inlet port connected to the fluid supply inlet conduit and the flow of fluid out of an outlet port also connected to the fluid supply inlet conduit without using a valve in the fluid supply inlet conduit.

17. The method of claim 16, comprising varying a cross-sectional area of a conduit leading from the outlet port or of the fluid flow conduit bringing the fluid inlet and outlet port into fluid communication.

18. The method of claim 17, further comprising flowing fluid, in parallel to the first valve, through a by-pass conduit comprising a flow restrictor.

19. The method of claim 16, comprising varying a cross-sectional area of a conduit which places the inlet port in fluid communication with a drain.

20. The method of claim 16, comprising controlling a valve to vary the flow of fluid through the inlet and outlet ports to change the flow rate of fluid through the fluid inlet conduit.

21. A device manufacturing method comprising projecting a patterned beam of radiation, through a fluid confined in a space between a projection system and a substrate using a fluid confinement system, onto the substrate, wherein the fluid confinement system comprises:
  a fluid supply inlet through which a flow of fluid is directed with a component towards the substrate and/or a substrate table configured to support a substrate; and
  an extraction outlet through which fluid from the fluid supply inlet and/or gas from outside of the fluid confinement system are extracted, the extraction outlet being in a first surface of the fluid confinement system, the extraction outlet located further from the substrate and/or a substrate table than the fluid supply inlet located in a second surface,
  wherein the first surface, the second surface, or both the first and second surface, has a first flat portion that extends from a side of the respective inlet and/or outlet toward the patterned beam and a second flat portion, co-planar with the first flat portion, that extends from an opposite side thereto of the respective inlet and/or outlet away from the patterned beam,
  wherein the first surface is substantially parallel to a top surface of the substrate and/or substrate table,
  wherein, in use, the first surface is about $1/10$ to 3 times further from the substrate and/or substrate table than the second surface, and
  wherein the extraction outlet is the most radially outward active component in the underside of the fluid confinement system, relative to an optical axis of the projection system.

22. A device manufacturing method comprising:
  projecting a patterned beam of radiation through a fluid confined in a space using a fluid confinement system;
  supplying fluid through a fluid inlet conduit of the fluid confinement system, the fluid inlet conduit having an opening to the space at one end and intersecting at the other end a fluid flow conduit having an inlet port and an outlet port, the inlet port and the outlet port being upstream and downstream, respectively, of the intersection between the fluid inlet conduit and the fluid flow conduit; and
  controlling fluid flow through the fluid inlet conduit by varying the flow rate of fluid provided to the inlet port and the flow rate of fluid removed from the outlet port without using a valve in the fluid inlet conduit.

* * * * *